United States Patent
Kurogi

(10) Patent No.: US 7,358,153 B2
(45) Date of Patent: Apr. 15, 2008

(54) METHOD FOR CUTTING JUNCTION BOARD, AND CHIP

(75) Inventor: Takashi Kurogi, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/415,148

(22) Filed: May 2, 2006

(65) Prior Publication Data
US 2006/0276009 A1 Dec. 7, 2006

(30) Foreign Application Priority Data
Jun. 3, 2005 (JP) ............... 2005-163658

(51) Int. Cl.
*H01L 21/00* (2006.01)
*H01L 23/544* (2006.01)

(52) U.S. Cl. ............... 438/460; 438/113; 257/620; 257/E21.599; 257/E21.602

(58) Field of Classification Search ............... 438/33
See application file for complete search history.

(56) References Cited

U.S. PATENT DOCUMENTS
6,995,032 B2 * 2/2006 Bruhns et al. ............... 438/33

FOREIGN PATENT DOCUMENTS
JP 05-285935 11/1993
JP 05-285937 11/1993
JP 06-268060 9/1994

* cited by examiner

Primary Examiner—David A. Zarneke
(74) Attorney, Agent, or Firm—Rabin & Berdo, PC

(57) ABSTRACT

A junction board cutting method includes, upon cutting a junction board formed by bonding a second main surface of a first substrate having a first main surface provided with chip areas and scribe areas demarcating the chip areas from one another and the second main surface, and a fourth main surface of a second substrate having a third main surface and the fourth main surface along the scribe areas and separating the same every chip, (1) a step for performing wet etching on areas given by orthogonal projection of the scribe areas to the third main surface to expose the second main surface, thereby defining concave groove, and (2) a step for performing dicing along the scribe areas until the exposed second main surface is reached, thereby to cut the junction board.

18 Claims, 7 Drawing Sheets

METHOD FOR CUTTING JUNCTION BOARD, AND CHIP

BACKGROUND OF THE INVENTION

The present invention relates to a method for cutting a junction board provided with chip areas including integrated circuits every chip area, and a chip obtained by using the cutting method.

There have been proposed various ones as a method for cutting a substrate or board provided with chip areas including integrated circuits for every individual chip area. Related arts will be explained below by citing three examples.

(First Related Art)

A substrate having chip areas provided on one main surface thereof is prepared, and the chip areas are protected by a protective film or the like. In this condition, grooves are defined in cutting predeterminate areas by wet etching. Then, the substrate is cut in widths narrower than the widths of the grooves from one main surface side using a grindstone (dicing blade) to thereby separate individual chips from one another (refer to, for example, a patent document 1 (Japanese Unexamined Patent Publication No. Hei 6(1994)-268060 (Page 2 and FIG. 1)).

(Second Related Art)

A substrate having chip areas provided on one main surface thereof is prepared. Wet etching is performed in the direction orthogonal to an OF (Orientation·Flat) from the other main surface side of the substrate to form separation grooves extending to one main surface. Then, the substrate is cut in the direction parallel to the OF from one main surface side using a grindstone to separate individual chips (refer to, for example, a patent document 2 (Japanese Unexamined Patent Publication No. Hei 5(1993)-285935 (Pages 3 and 4 and FIG. 1)).

(Third Related Art)

A substrate having chip areas provided on one main surface thereof is prepared. Halfcut dicing is performed in the direction parallel to an OF as viewed from one main surface side of the substrate to form cutting grooves. Then, the whole surface of the substrate is thinned up to the cutting grooves from the other main surface of the substrate. Finally, wet etching is performed in the direction orthogonal to the OF as viewed from the other main surface side to separate individual chips (refer to, for example, a patent document 3 (Japanese Unexamined Patent Publication No. Hei 5(1993)-285937 (Pages 3 and 4 and FIG. 2).

Meanwhile, any of the first through related arts relates to a method for cutting a substrate formed of a single material. No consideration has been made as to the cutting of a junction board in which two types of substrates different in hardness from each other are bonded to each other.

A method called step cut has heretofore been used in the cutting of the junction board. The step cut is a method for exchanging dicing blades for each of two types of substrates constituting a junction board and cutting the junction board. That is, a problem arises in that the cutting of the junction board must be carried out in two stages upon the step cut and hence it takes a long time to cut it by the dicing blade.

SUMMARY OF THE INVENTION

The present invention has been made in view of such problems. It is therefore a first object of the present invention to provide a method for cutting a junction board in which two types of substrates different in hardness from each other are bonded to each other, which method is capable of upon cutting the junction board every chip area including integrated circuits to thereby obtain individual chips, shortening the time required to cut the junction board by a dicing blade as compared with a conventional one.

A second object of the present invention is to provide a chip obtained by using the present junction board cutting method.

According to a first aspect of the present invention, for attaining the above objects, there is provided a method for cutting a junction board formed by bonding a second main surface of a first substrate having a first main surface provided with a plurality of chip areas and scribe areas demarcating a plurality of the chip areas from one another and the second main surface opposite to the first main surface, and a fourth main surface of a second substrate harder than the first substrate, having a third main surface and the fourth main surface opposite to the third main surface, the method comprising the following steps of, upon cutting the junction board along the scribe areas and separating the same every chip:

(1) performing wet etching on areas given by orthogonal projection of the scribe areas to the third main surface from the third main surface to expose the second main surface, thereby defining concave grooves in the junction board, and (2) performing dicing using a dicing blade along the scribe areas of the first mains surface until the exposed second main surface is reached, thereby to cut the junction board.

According to the junction board cutting method of the first aspect, the areas given by the orthogonal projection of the scribe areas to the third main surface (second substrate) are removed by etching from the third main surface in the step (1) to thereby form the concave grooves from which the second main surface (first substrate) is exposed. That is, only the second substrate is cut in the step (1). Thereafter, in the step (2), dicing is performed from the first main surface (first substrate) to the exposed second main surface along the scribe areas. That is, only the first substrate is cut along areas corresponding to the concave grooves in the step (2). It is thus possible to cut the junction board every chip.

Here, the term "the areas given by the orthogonal projection of the scribe areas to the third main surface" indicate areas obtained by vertically projecting the scribe areas existing in the first main surface onto the third main surface. Thus, the "areas given by the orthogonal projection of the scribe areas to the third main surface" exist in the same shapes and positions as the scribe areas in the third main surface.

According to a second aspect of the present invention, for attaining the above objects, there is provided a method for cutting a junction board formed by bonding a second main surface of a first substrate having a first main surface provided with a plurality of chip areas and scribe areas demarcating a plurality of the chip areas from one another and the second main surface opposite to the first main surface, and a fourth main surface of a second substrate harder than the first substrate, having a third main surface and the fourth main surface opposite to the third main surface, the method comprising the following steps of, upon cutting the junction board along the scribe areas and separating the same every chip:

(1) performing dicing along the scribe areas from the first main surface using a dicing blade until the fourth main surface is exposed, to thereby define concave grooves in the junction board, and (2) performing wet etching on areas given by orthogonal projection of the scribe areas to the third main surface from the third main surface until the exposed fourth main surface is reached, to cut the junction board, thereby obtaining the chips.

According to the junction board cutting method of the second aspect of the present invention, dicing along the scribe areas is carried out from the first main surface (first substrate) in the step (1) to form the concave grooves from which the fourth main surface (second substrate) is exposed. That is, only the first substrate is cut in the step (1). Thereafter, in the step (2), the areas given by the orthogonal projection of the scribe areas to the third main surface (second substrate) are removed from the third main surface to the exposed fourth main surface by etching. That is, only the second substrate is cut along the areas corresponding to the concave grooves in the step (2). It is thus possible to cut the junction board every chip.

According to a third aspect of the present invention, for attaining the above objects, there is provided a method for cutting a junction board formed by bonding a second main surface of a first substrate having a first main surface provided with a plurality of chip areas and scribe areas demarcating a plurality of the chip areas from one another and the second main surface opposite to the first main surface, and a fourth main surface of a second substrate harder than the first substrate, having a third main surface and the fourth main surface opposite to the third main surface, the method comprising the following steps of, upon cutting the junction board along the scribe areas and separating the same every chip:

(1) performing wet etching on areas given by orthogonal projection of the scribe areas to the third main surface from the third main surface to intermittently form concave grooves from which the second main surface is exposed, and thereby forming linear concavo-convex structures in which the concave grooves adjacent to one another along the areas given by the orthogonal projection of the scribe areas to the third main surface are separated from one another by wall-thick portions used as non-etching areas, and (2) performing dicing on the scribe areas from the first main surface using a dicing blade up to the exposed second main surface at portions corresponding to the concave grooves and up to the third main surface at portions corresponding to the wall-thick portions to thereby cut the junction board.

According to the junction board cutting method of the third aspect of the present invention, the linear concavo-convex structures are formed along the areas associated with the scribe areas of the second substrate in the step (1). That is, in the linear concavo-convex structures, the concave grooves from which the second main surface (first substrate) is exposed, are separated by the wall-thick portions used as non-etching areas of the second substrate. Hence, when dicing is carried out from the first main surface (first substrate) in the step (2), only the thickness of the first substrate may be cut in the above concave grooves. Thus, in the step (2), the total value of the thickness of the junction board which must be cut by the dicing blade can be made smaller than conventional.

According to each of the junction board cutting methods according to the first through third aspects of the present invention, when the junction board is cut, the junction board can be cut without performing the conventionally used step cut. It is therefore possible to shorten the time required to perform dicing.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described with reference to FIGS. 1 through 7. Incidentally, the shape, size and physical relationship of each constituent element in the figures are merely approximate illustrations to enable an understanding of the present invention. While preferred configurational examples of the present invention are explained below, the material and numerical conditions of each constituent element, etc. are nothing more than mere preferred examples. Accordingly, the present invention is by no means limited to the embodiments to be described below.

First Preferred Embodiment

Figure 1A:
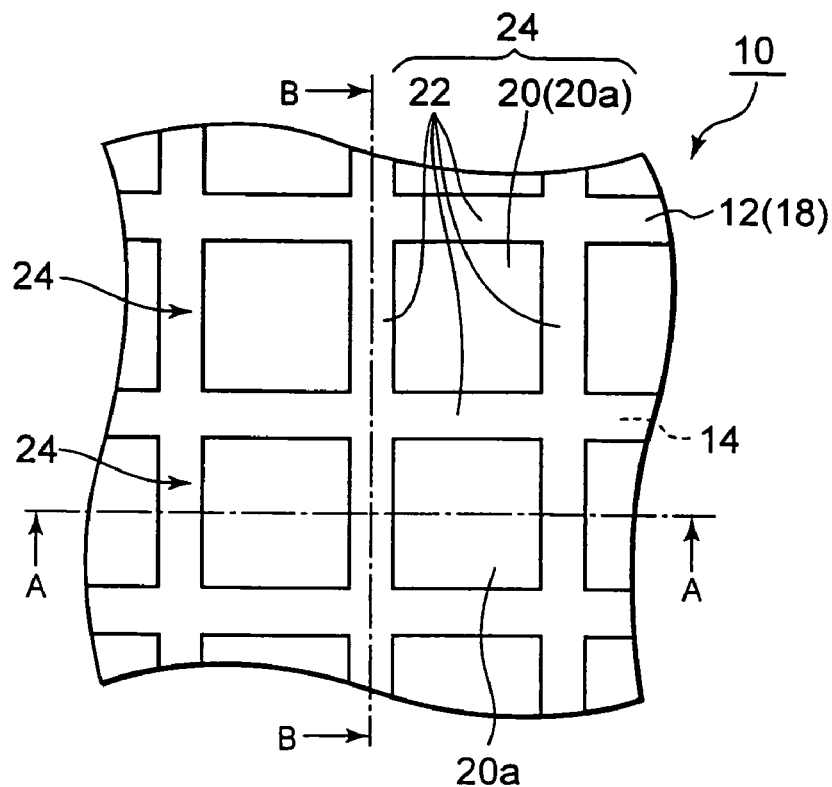
FIG. 1(A) is a fragmentary enlarged plan view of a junction board according to a first embodiment.
Figure 1B:
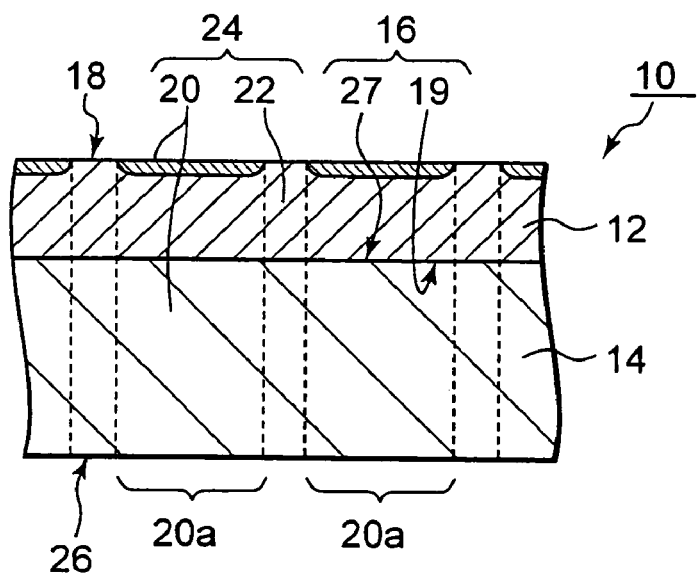
FIG. 1(B) is a sectional view taken along line A-A of FIG. 1(A)

A method for cutting a junction board, according to a first embodiment of the present invention will be explained with reference to FIGS. 1 through 3. FIG. 1(A) is a fragmentary enlarged plan view showing one example of the junction board. FIG. 1(B) is a sectional view taken along line A-A of FIG. 1(A). FIGS. 2(A) through 2(D) are respectively fragmentary enlarged process sectional views taken along line B-B of FIG. 1(A). FIGS. 3(A) through 3(D) are respectively fragmentary enlarged process plan views of the junction board, which are associated with FIGS. 2(A) through 2(D).

As shown in FIG. 1(A) and FIG. 1(B), the junction board 10 includes an Si substrate 12 used as a first substrate, and a glass substrate 14 used as a second substrate both of which are bonded to each other in its thickness direction at a junction surface 16. Here, the Si substrate 12 is provided with a first main surface 18 and a second main surface 19 opposite to the first main surface 18. The glass substrate 14 includes a third main surface 26 and a fourth main surface 27 opposite to the third main surface 26. The junction surface 16 comprises the second main surface 19 and the fourth main surface 27.

The figures showing cross sections on section lines AA and BB in FIG. 1A also show that the second surface 19 and the fourth surface 27 are planar (flat), because these surfaces appear as straight lines in all the views, some of which are at right angles to others. Geometrically, only a plane can appear as straight lines in two perpendicular cuts.

In the junction board 10, rectangular integrated circuits 20, 20, . . . in which a large number of elements are integrated are formed in the first main surface 18 of the Si substrate 12. Attention will now be paid to one arbitrary integrated circuit 20. The integrated circuit 20 is demarcated by other adjacent integrated circuits 20, 20, . . . and scribe areas 22. The scribe areas 22 are also called "scribe lines" and correspond to linear cutting lines each having a constant width at the time that the junction board 10 is cut every individual chip area 24, as is well known.

Incidentally, in the subsequent description, the scribe areas 22 respectively indicate three-dimensional areas having the thickness of the junction board 10, extending from the first main surface 18 to the third main surface 26. Described more specifically, the scribe areas 22 include the junction board 10 between the scribe areas 22 of the first main surface 18 and areas given by orthogonal projection of the scribe areas 22 relative to the third main surface.

An area in which each integrated circuit 20 is formed, indicates not only a plane area formed in the first main surface 18 of the Si substrate 12 but also a three-dimensional area having the thickness of the junction board 10, extending from the first main surface 18 of the Si substrate 12 to the third main surface 26 of the glass substrate 14. Incidentally, when it is necessary to indicate an area corresponding to the "area of the integrated circuit 20 in the third main surface 26 of the glass substrate 14, it will be expressed as "an integrated circuit area 20a".

One chip area 24 is constituted of one integrated circuit 20 and the scribe areas 22 that surround its periphery. The one chip area 24 shares the scribe areas 22 among the corresponding chip area 24 and other adjacent chip areas 24.

When the chip areas 24 are individually separated from one another through process steps to be described later here, the individual chip areas 24 separated from one another will be called simply "chips 25. That is, the chip 25 comprises one integrated circuit 20 and the uncut remaining portions of the scribe areas 22 which surround its periphery.

Here, the Si substrate 12 is assumed to be, for example, 100 μm or so in thickness. The glass substrate 14 is assumed to be, for example, 500 μm or so in thickness. The junction board is formed by bonding the second main surface 19 of the Si substrate 12 and the fourth main surface 27 of the glass substrate 14 to each other by an anodic bonding method. That is, the second main surface 19 of the Si substrate 12 and the fourth main surface 27 of the glass substrate 14 are superimposed on each other to form one junction surface 16. In this state, both 12 and 14 are heated to 300° to 400° C., for example. Simultaneously with this heating, a voltage of 500V or so is applied to the glass substrate 14 to thereby bond both substrates 12 and 14 to each other at the junction surface 16.

The width of the scribe area 22 as viewed in the direction orthogonal to its extending direction changes depending upon the width of a dicing blade as will be described later. In the present embodiment, however, the width thereof is assumed to be 150 μm, for example. The size of one chip area 24 is assumed to be about 3 mm wide by 3 mm high, for example.

A cutting method for bringing the junction board 10 into fractionization every chip area 24 to form the chips 25 will subsequently be explained with reference to FIGS. 2 and 3.

Figure 2A:
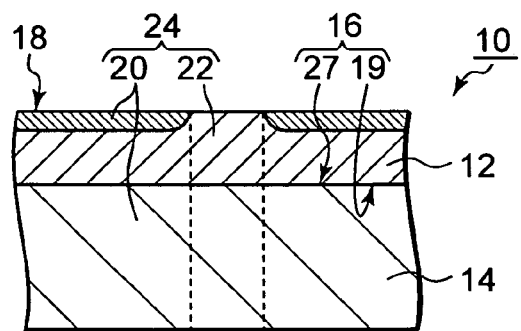
FIG. 2 is a process sectional view taken along line B-B of FIG. 1(A), according to the first embodiment.
Figure 3A:
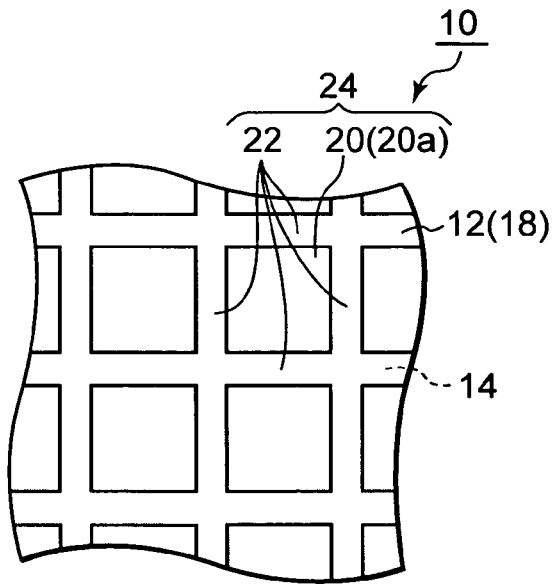
FIGS. 3(A) through 3(D) are respectively fragmentary enlarged process plan views of the junction board corresponding to FIGS. 2(A) through 2(D), according to the first embodiment.

As shown in FIGS. 2(A) and 3(A), a junction board 10 in which integrated circuits 20 are formed in a first main surface 18 of an Si substrate 12, is first prepared. Incidentally, the first main surface 18 of the Si substrate 12 is also called simply "Si-substrate side main surface 18 in the subsequent description.

(Process Step 1-i)

Figure 2B:
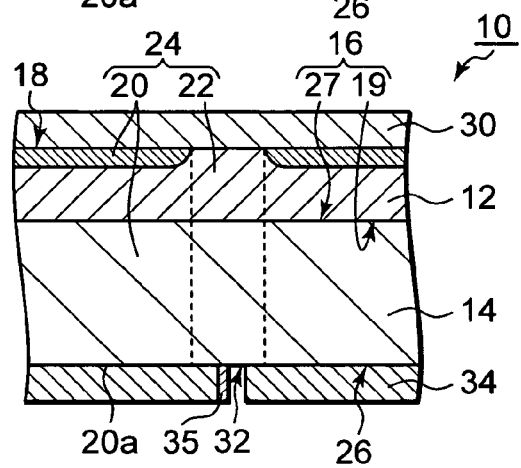
Figure 3B:
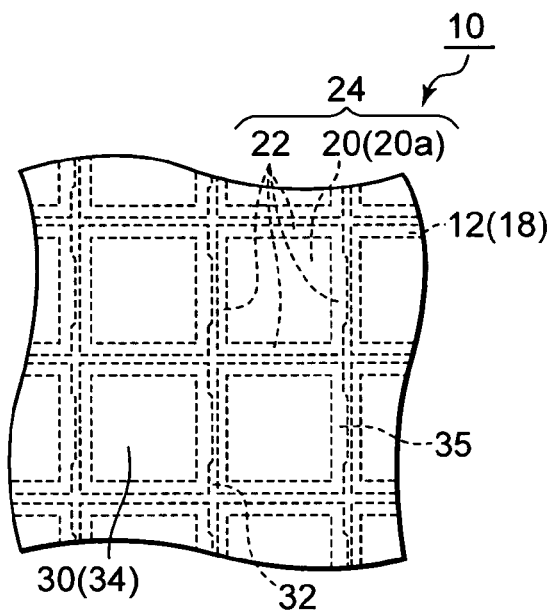

Subsequently, as shown in FIGS. 2(B) and 3(B), the junction board 10 is covered with a positive type photoresist 30.

Described more specifically, the whole area of the Si-substrate side main surface 18 is first covered with the positive type photoresist 30. This is achieved by applying the positive type photoresist 30 onto the whole area of the Si-substrate side main surface 18 by a spin coater or the like and developing it without its exposure.

Similarly, a third main surface 26 of a glass substrate 14 is covered with a positive type photoresist 34. That is, the third main surface is coated with the positive type photoresist 34 in such a manner that openings or apertures each having a width narrower than the width of each scribe area 22 are formed along the scribed areas 22 with the transverse-direction centers of the scribe areas 22 as the centers. This stripe-shaped aperture results in an etching predeterminate area 32 for etching the glass substrate 14. Incidentally, the third main surface 26 of the glass substrate 14 is also called simply "glass-substrate side main surface 26 in the following description. Here, the width of the etching predeterminate area 32 is assumed to be, for example, about 60 μm at a portion other than an area 35 associated with a convex portion or protrusion 40 to be described later.

Let's now consider where the convex portion 40 is formed in the right side of each chip area 24 as a sign indicative of the direction of each chip 25. In this case, there is a need to adjust the shape of the etching predeterminate area 32 in the area 35 corresponding to the convex portion 40. That is, the sidewall of the strip-like aperture is partly protruded toward the center of the scribe area 22 by the constant and same width. In other words, the positive type photoresist 34 is protruded, for example, about 50 μm in the etching predeterminate area 32 associated with the right side of the chip area 24 so as to extend out outside the integrated circuit area 20a and covers the glass-substrate side main surface 26 from above. Thus, the width of the etching predeterminate area 32 becomes narrower than that of other portion by the protruded width of the positive type photoresist 34, e.g., its width results in about 10 μm.

The above-described etching predeterminate areas 32 are formed by applying the positive type photoresist 34 over the whole area of the glass-substrate side main surface 26, exposing the same using a mask having predetermined patterns and thereafter developing it.

Thus, a junction board 10 is obtained wherein the etching predeterminate areas 32 are exposed in stripe form substantially along the scribe areas 22.

(Process Step 1-ii)

Figure 2C:
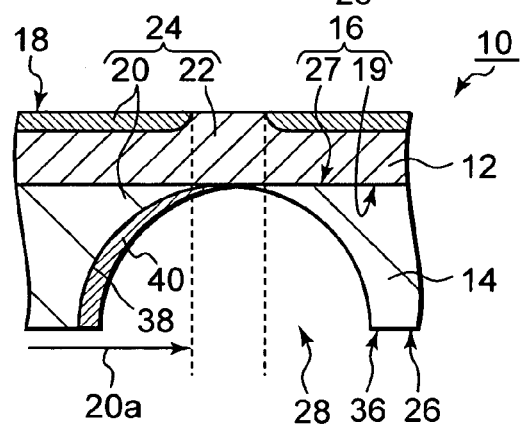
Figure 3C:
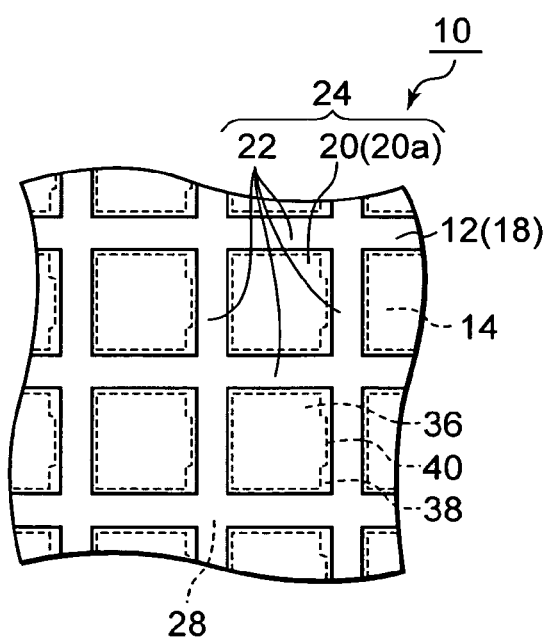
Figure 3D:
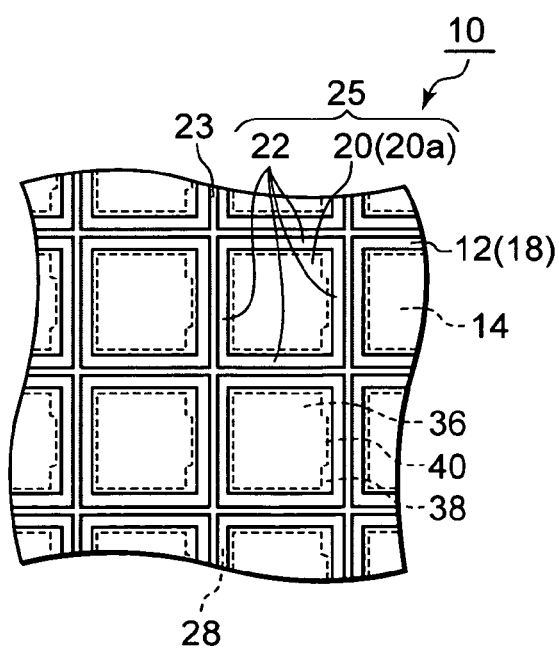

Subsequently, as shown in FIG. 2(C) and FIG. 3(C), wet etching is performed along the scribe areas 22 from the glass-substrate side main surface 26 of the junction board 10. With the execution of this wet etching, hollow or concave grooves 28 each having a depth at which the second main surface 19 of the Si substrate 12 is exposed, are formed in the third main surface 26 of the glass substrate 14. Thus, the junction board 10 is made thin until each wet-etched portion reaches the junction surface 16.

Described in more detail, the junction board 10 having undergone the (Process Step 1-i) is immersed in a hydrofluoric acid solution (HF). Thus, the wet etching isotropically proceeds in each etching predeterminate area 32 and hence the junction board 10 is thinned from the glass substrate 14 side to thereby form the concave groove 28. Then, the wet etching proceeds by the thickness of the glass substrate 14 and thereafter such wet etching is caused to stop at the stage in which the junction surface 16 is reached, thus, at the stage of exposure of the second main surface 19 of the Si substrate 12. At the mention of the timing provided to stop the wet etching here, a preliminary test is done in advance to find out the relationship between an etching time and an etching depth. Thereafter, the timing is determined based on the etching rate of the glass substrate 14, which has been determined from the above relationship. Then, the positive type photoresists 30 and 34 are removed by ashing or the like.

Thus, the junction board 10 formed with the concave grooves 28 is obtained.

Here, in order to allow the wet etching using the hydrofluoric acid solution to isotropically proceed, such wet etching proceeds not only in the direction of the thickness of the glass substrate 14 in each etching predeterminate area 32 but also in its width direction. That is, the hydrofluoric acid solution etches even the lower side of the positive type photoresist 34 which covers both sides of each etching predeterminate area 32. Thus, the width of each concave groove 28 formed by the wet etching becomes wider than the width (about 60 μm) of the etching predeterminate area 32.

The etching rate related to the direction of the width of the etching predeterminate area 32 is equal to that in the direction of the thickness of the glass substrate 14. Thus, the wet etching proceeds even in the width direction of the etching predeterminate area 32 to the same degree as in the thickness direction. Thus, each of the concave grooves 28 formed along the scribe areas 22 becomes 500 μm in depth and about 1 mm in width. Here, the width of the concave groove 28 is formed wider than the width (35 μm) of the dicing blade to be described later.

Thus, the concave groove 28 is formed by the wet etching that proceeds isotropically. Consequentially, the concave grooves 28 provided in the four sides around each integrated circuit area 20a are formed so as to erode the inside of the integrated circuit area 20a. Consequently, a substantially rectangular non-etching area 36 one size smaller than each integrated circuit area 20a remains and is formed on the glass-substrate side main surface 26 side.

A convex portion 40 is formed in one side of the four sides constituting an outer edge 38 of the non-etching area 36, e.g., the non-etching area 36 corresponding to the right side (refer to FIG. 3(C)) of the chip area 24. That is, the convex portion 40 is formed on its corresponding sidewall of the concave groove 28. The amount of protrusion of the convex portion 40 to the outside of the integrated circuit area 20a is equal to the amount of protrusion of the area 35 associated with the above concave portion 40 and is about 50 μm.

Concavo-convex shapes of the outer edges 38 of the respective chip areas 24 are formed substantially in the same fashion. Accordingly, the above convex portions 40 are repeatedly formed in all the chip areas 24 existing in the junction board 10 at the same positions of the chip areas 24 with one chip area 24 as a repetitive unit.

When a rotational operation is effected on an arbitrary chip area 24 within a plane parallel to the Si-substrate side main surface 18 with the center point of the chip area 24 as a rotational axis, the concavo-convex shape of the outer edge 38 in the non-etching area 36 has a rotational symmetry through more than once and less than twice (i.e., once alone) in the arbitrary chip area 24 due to the existence of the convex portion 40. That is, only when the chip area 24 is rotated 360° within the plane parallel to the Si-substrate side main surface 18 with the center point of the chip area 24 as the rotational axis, the concavo-convex shape of the outer edge 38 in the non-etching area 36 coincides with its original shape. Since the chip area 24 is rectangular here, the center point of the chip area 24 corresponds to an intersection point of two diagonal lines of the present rectangle.

(Process Step 1-iii)

Figure 2D:
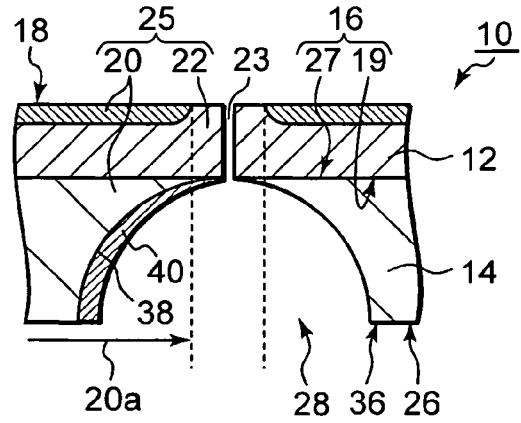

Subsequently, as shown in FIG. 2(D), dicing using a dicing blade is performed from the Si-substrate side main surface 18 of the junction board 10 along cut lines 23 placed in the central portions of the scribe areas 22 as viewed in their transverse directions.

Described in more detail, the glass-substrate side main surface 26 of the junction board 10 formed with the concave grooves 28 is applied onto a wafer mounting UV tape and set to a dicer. In this condition, the junction board 10 is thinned from the Si-substrate side main surface 18 to the concave grooves 28 by means of the high-speed rotated dicing blade, whereby the junction board 10 is cut. Thus, the individual chip areas 24 are separated from one another to obtain the respective chips 25.

Now, the blade width of the dicing blade is 35 μm. Its material is one in which diamond fine particles are mixed in nickel plating. A rotational speed of the dicing blade at the dicing is about 20,000 rpm, for example.

The chips 25 separated from one another in this way, respectively have the convex portions 40 protruded outside the integrated circuit areas 20a at portions associated with the right sides of the outer edges 38 of the non-etching areas 36. Thus, when a rotational operation is effected on each of the chips 25 within the plane parallel to the Si-substrate side main surface 18 with the center point of the chip 25 as the center of its rotation, the chip 25 has a rotational symmetry through more than once and less than twice (i.e., once alone).

Thus, according to the method for cutting the junction board 10, according to the present embodiment, the glass substrate 14 is we-etched along the scribe areas 22 to form the concave grooves 28 in the (Process Step 1-i) and (Process Step 1-ii). Thereafter, in the (Process Step 1-iii), only the Si substrate 12 is cut by dicing. Thus, it is not necessary to carry out the step cut conventionally used in cutting of the junction board 10 to which the substrates different in hardness have been bonded. As a result, the time required to cut it by the dicing blade can be shortened.

By setting the width of each concave groove 28 wider than the width (35 μm) of the dicing blade, the convex portion 40 having such an amount of its protrusion that it is not cut upon dicing, can be formed on the sidewall of the concave groove 28.

Since the concavo-convex shape of each non-etching area 36 is set so as to have the rotational symmetry through once alone by forming the convex portion 40 in the chip area 24 at the portion associated with the right side of the outer edge 38 of the non-etching area 36, this shape can be set as the sign indicative of the direction of the chip 25.

Since the concavo-convex shape of the non-etching area 36, corresponding to the sign indicative of the direction of the chip 25 is formed by the work of merely adjusting the shape of the etching predeterminate area 32 and providing the area 35 corresponding to the convex portion 40, the sign can easily be formed without addition of a new process step or the like.

Incidentally, although each of the concave grooves 28 is set to the depth which extends from the glass-substrate side main surface 26 to the junction surface 16, it may be set to a depth which extends beyond the junction surface 16 and enters into the Si substrate 12. Since the thickness of the Si substrate 12 which must be cut by the dicing blade in the (Process Step 1-iii) is reduced by doing so, dicing can be carried out more promptly.

If the convex portions 40 formed in the outer edges 38 are formed repeatedly at the same positions over all the chip areas 24 and the shapes of the non-etching areas 36 function as the signs each indicative of the direction of the chip 25, then no particular limitations are imposed on their shapes and the number thereof. For instance, both convex and concave portions or either one of them may be taken or waveform shapes in which a plurality of depressions and projections or irregularities are continuous may be adopted.

If the convex portions 40 need not to be formed only at the outer edges 38 corresponding to the right sides of the chip areas 24 and are formed repeatedly at the same positions over all the chip areas 24, and the shapes of the non-etching areas 36 function as the signs each indicative of the direction of the chip 25, then the convex portions 40 may be formed at any of the outer edges corresponding to the four sides that surround each of the chip areas 24. Alternatively, the convex portions 40 may be formed in plural portions of the outer edges corresponding to the four sides that surround each of the chip areas 24.

The width of each of the scribe areas 22 may preferably be about 100 μm wider than the width of the dicing blade. By doing so, chipping or the like at the dicing can be suppressed.

While the dicing in the (Process Step 1-iii) is performed along the center lines as viewed in the transverse directions, of the scribe areas 22, no problem occurs even though the convex portions 40 are shifted from the transverse center lines of the scribe areas 22 if the convex portions 40 are not cut and fall within the width ranges of the scribe areas 22 respectively. If the dicing is carried out on the right side as viewed from the center lines of the scribe areas 22 in FIGS. 2(D) and 3(D), for example, then the amount of protrusion of each convex portion 40 can be made larger than the value (50 μm) employed in the present embodiment.

The size and shape of the chip area 24 are not limited to a square shape of 3×3 mm. They can be set to a suitable size and shape corresponding to the design.

Although one in which the Si substrate 12 and the glass substrate 14 harder than the Si substrate 12 have been bonded to each other, is illustrated as the junction board 10, no particular limitations are imposed on a combination of substrates constituting the junction board if two types of substrates different in hardness are bonded in the thickness direction and the hard substrate can be wet-etched.

The thicknesses of the Si substrate 12 and the glass substrate 14 are not limited to ones employed in the present embodiment but can be set to suitable thicknesses corresponding to the design.

Although the junction board 10 is covered with the positive type photoresists 30 and 34 in the present embodiment, a negative type photoresist may be used.

Second Preferred Embodiment

A method for cutting a junction board, according to a second embodiment of the present invention will be explained with reference to FIGS. 4 and 5.

FIGS. 4(A) through 4(D) are respectively fragmentary enlarged process sectional views taken along line B-B of FIG. 1(A). FIGS. 5(A) through 5(D) are respectively fragmentary enlarged process plan views of the junction board, which are associated with FIGS. 4(A) through 4(D).

Incidentally, the second embodiment makes use of the junction board 10 similar to the first embodiment. Thus, the same constituent elements are given the same reference numerals in the junction board 10, and their description will therefore be omitted.

A cutting method for bringing the junction board 10 into fractionization every chip area 24 to form chips 25 will be explained with reference to FIGS. 4 and 5.

Figure 4A:
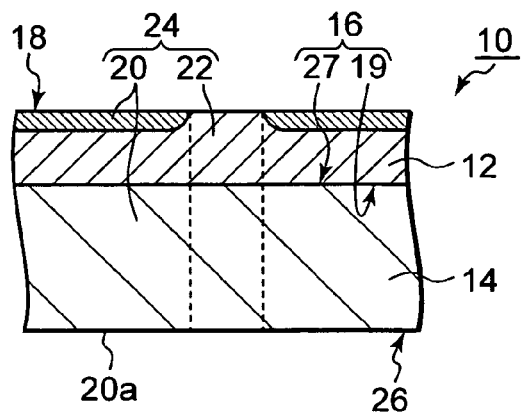
FIG. 4 is a process sectional view taken along line B-B of FIG. 1(A), according to a second embodiment.
Figure 5A:
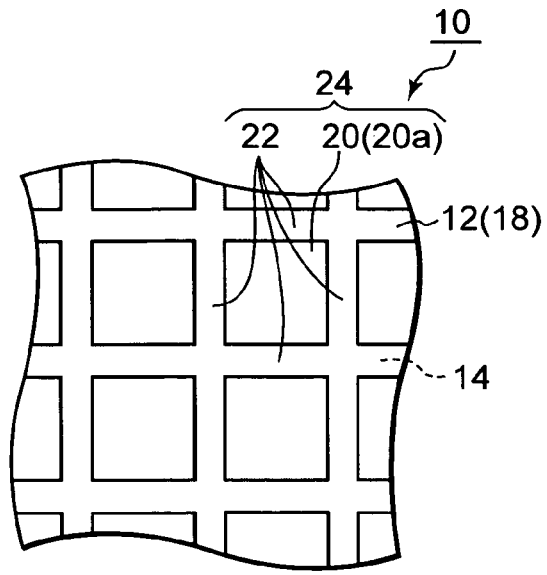
FIGS. 5(A) through 5(D) are respectively fragmentary enlarged process plan views of the junction board corresponding to FIGS. 4(A) through 4(D), according to the second embodiment.

As shown in FIGS. 4(A) and 5(A), a junction board 10 in which integrated circuits 20 are formed in an Si-substrate side main surface 18, is first prepared.

(Process Step 2-i)

Figure 4B:
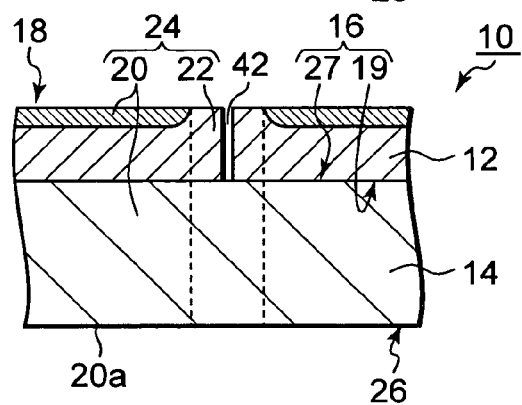
Figure 5B:
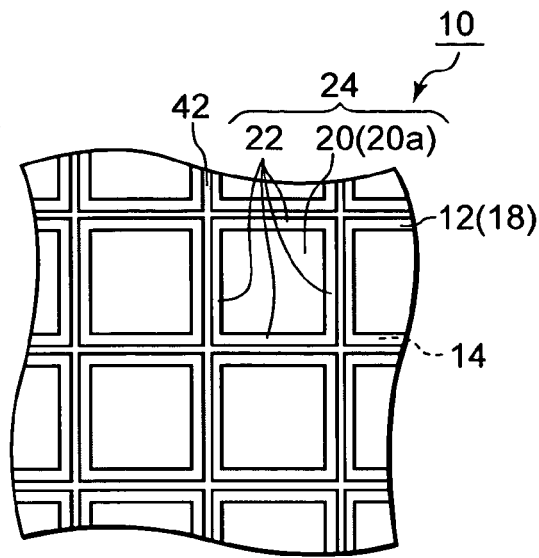

Subsequently, as shown in FIG. 4(B) and FIG. 5(B), dicing using a dicing blade is performed from the Si-substrate side main surface 18 of the junction board 10 along the center lines of scribe areas 22 as viewed in their width directions. Thus, the junction board 10 is thinned from the Si-substrate side main surface 18 to a junction surface 16, so that concave grooves 42 that have exposed a fourth main surface 27 of a glass substrate 14 are formed. That is, the concave grooves 42 are formed by performing dicing after the depth of intrusion of the dicing blade into an Si substrate 12 has been adjusted to 100 μm.

A specific procedure and the width and material of the used dicing blade, and the number of revolutions thereof in the (Process Step 2-i) are similar to those in the (Process Step 1-ii) of the first embodiment.

(Process Step 2-ii)

Figure 4C:
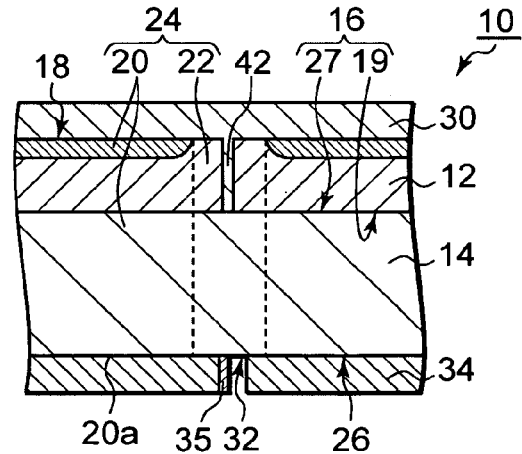
Figure 5C:
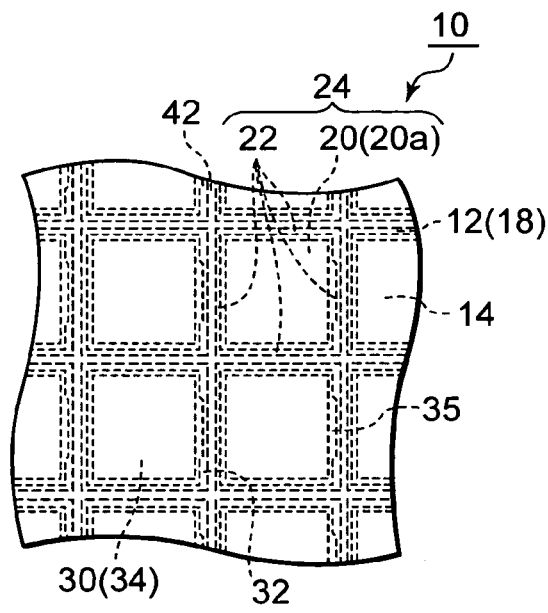

Subsequently, as shown in FIG. 4(C) and FIG. 5(C), the junction board 10 is covered with a positive type photoresist 30.

Described in more detail, the whole area of the Si-substrate side main surface 18 is first covered with the positive type photoresist 30. A specific procedure for this work is similar to the (Process Step 1-i) of the first embodiment.

Next, a third main surface 26 of the glass substrate 14 is covered with a positive type photoresist 34. That is, the third main surface 26 is coated with the positive type photoresist 34 in such a manner that openings or apertures each having a width narrower than the width of each scribe area 22 are formed along the scribed areas 22 with the transverse-direction centers of the scribe areas 22 as the centers. This stripe-shaped aperture results in an etching predeterminate area 32 for etching the glass substrate 14. Here, the width of the etching predeterminate area 32 is assumed to be, for example, about 100 μm at a portion other than an area 35 associated with a convex portion or protrusion 40 to be described later.

Here, the sidewall of the strip-like aperture is partly protruded toward the center of the scribe area 22 by the constant and same width in the area 35 corresponding to the convex portion 40 in the etching predeterminate area 32 corresponding to the right side of the chip area 24. In other words, the positive type photoresist 34 is protruded, for example, about 80 μm in the etching predeterminate area 32 associated with the right side of the chip area 24 so as to extend out outside an integrated circuit area 20a and thereby covers the third main surface 26. Thus, the width of the etching predeterminate area 32 in the area 35 corresponding to each of the convex portions 40 becomes narrower than that of other portion by the protruded width of the positive type photoresist 34, i.e., its width results in about 20 cm. A specific procedure for this work is similar to the (Process Step 1-i) of the first embodiment.

Thus, the junction board 10 is obtained in which the etching predeterminate areas 32 are exposed substantially along the scribe areas 22.

(Process Step 2-iii)

Figure 4D:
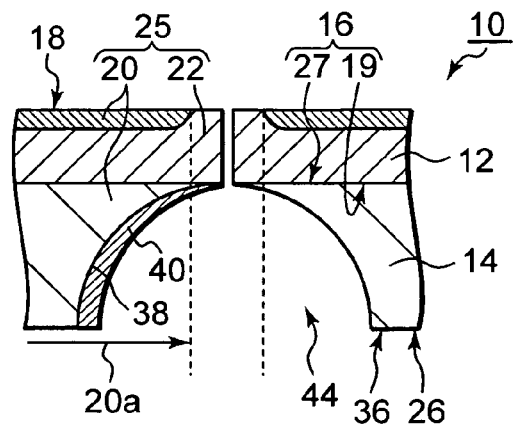

Subsequently, as shown in FIG. 4(D), wet etching is performed along the scribe areas 22 from a glass-substrate side main surface 26 of the junction board 10. With the wet etching, the junction board 10 is thinned up to the fourth main surface 27 of the glass substrate 14 in an area corresponding to the concave groove 42 in the glass-substrate side main surface 26, so that the chips 25 are obtained from which the individual chip areas 24 are cut and separated. Thereafter, the positive type photoresists 30 and 34 are removed by ashing or the like. A specific procedure for this work is similar to the (Process Step 1-ii) of the first embodiment.

Grooves 44, which are 500 μm in depth and about 1 mm in width, are formed along the scribe areas 22 through the (Process Step 2-iii). The grooves 44 are in continuation with their corresponding concave grooves 42 at portions from which the glass-substrate side main surface 26 at their tops is exposed. Thus, the chip areas 24 of the junction board 10 are cut into the individual chips 25.

Figure 5D:
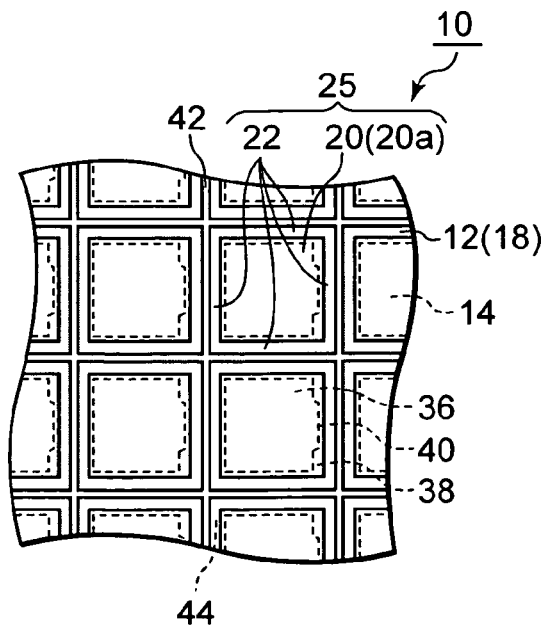

The grooves 44 are formed by wet etching which isotropically proceeds as mentioned above. Thus, as shown in FIG. 5(D), the grooves 44 provided in the four sides around each integrated circuit area 20a are formed in the glass-substrate side main surface 26 so as to erode the inside of the integrated circuit area 20a. Consequently, a substantially rectangular non-etching area 36 one size smaller than each integrated circuit area 20a is formed so as to remain.

The convex portion 40 is formed in one side of the four sides constituting an outer edge 38 of the non-etching area 36, e.g., the non-etching area 36 corresponding to the right side (refer to FIG. 5(D)) of each chip 25. That is, the convex portion 40 is formed on its corresponding sidewall of the groove 44. The amount of protrusion of the convex portion 40 to the outside of each integrated circuit area 20a is equal to the amount of protrusion of the area 35 associated with the above convex portion 40 and is about 80 μm.

Concavo-convex shapes of the outer edges 38 of the respective chips 25 are formed substantially in the same fashion. Accordingly, the above convex portions 40 are repeatedly formed in all the chips 25 existing in the junction board 10 at the same positions of the chips 25 with one chip 25 as a repetitive unit.

When a rotational operation is effected on an arbitrary chip 25 within a plane parallel to the Si-substrate side main surface 18 with the center point of the chip 25 as a rotational axis, the concavo-convex shape of the outer edge 38 in the non-etching area 36 has a rotational symmetry through more than once and less than twice (i.e., once alone) in the arbitrary chip 25 due to the existence of the convex portion 40. That is, only when the chip 25 is rotated 360° within the plane parallel to the Si-substrate side main surface 18 with the center point of the chip 25 as the rotational axis, the shape of the non-etching area 36 coincides with its original shape. Since the chip 25 is rectangular here, the center point of the chip 25 corresponds to an intersection point of two diagonal lines of the present rectangle.

The cutting method for the junction board according to the present embodiment brings about an operative effect substantially similar to that of the first embodiment.

In particular, according to the method for cutting the junction board 10, according to the present embodiment, only the Si substrate 12 is cut by dicing in the (Process Step 2-i). In the (Process Step 2-ii) and (Process Step 2-iii), the glass substrate 14 is wet-etched along the scribe areas 22 to form the grooves 44, whereby the chips 25 are obtained by cutting the junction board 10 every chip area 24. Thus, it is not necessary to carry out the step cut conventionally used in cutting of the junction board 10 to which the substrates different in hardness have been bonded. As a result, the time required to cut it by the dicing blade can be shortened.

There is no fear that since the wet etching is performed to form the grooves 44 after execution of the dicing in the (Process Step 2-i), the convex portions 40 formed in the grooves 44 are cut by dicing. Thus, the amount of protrusion of the convex portion 40 provided in each groove 44 is not restricted by the dicing. Consequently, the amount of protrusion (80 μm) of the convex portion 40 to the outside of each integrated circuit area 20a can be made larger than that (50 μm) obtained in the first embodiment.

Incidentally, although the depth of each concave groove 42 in the (Process Step 2-i) is set to a depth reaching the junction surface 16, it may be set to a depth which extends beyond the junction surface 16 and enters into the glass substrate 14. Since the depth at which the wet etching must be carried out is reduced in the (Process Step 2-iii) by doing so, the chip areas 24 can be cut into the chips 25 more promptly.

Incidentally, the shape of each convex portion 40 and the layout thereof in each chip 25 can be changed in various ways such as described in the first embodiment.

The width of the scribe area 22 may preferably be set to such a width as described in the first embodiment.

If the dicing in the (Process Step 2-i) falls within the width range of each scribe area 22, it may be shifted from the center line.

The size and shape of the chip area 24, the combination of the two types of substrates constituting the junction board 10, the thicknesses of the Si substrate 12 and the glass substrate 14, and the photoresists used in coating, and the like can be changed in various ways such as described in the first embodiment.

Third Preferred Embodiment

A method for cutting a junction board, according to a third embodiment of the present invention will be explained with reference to FIGS. 6 through 7.

FIGS. 6(A) through 6(D) are respectively fragmentary enlarged process sectional views taken along line B-B of FIG. 1(A). FIGS. 7(A) through 7(D) are fragmentary enlarged process plan views of the junction board, corresponding to FIGS. 6(A) through 6(D).

Incidentally, the third embodiment makes use of the junction board 10 similar to the first embodiment. Thus, the same constituent elements are given the same reference numerals in the junction board 10, and their description will therefore be omitted.

A cutting method for bringing the junction board 10 into fractionization every chip area 24 to form chips 25 will be explained with reference to FIGS. 6 and 7.

Figure 6A:
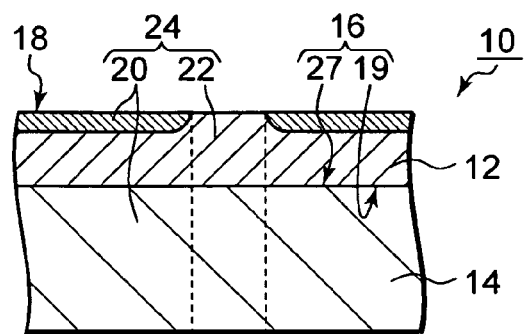
FIG. 6 is a process sectional view taken along line B-B of FIG. 1(A), according to a third embodiment.
Figure 7A:
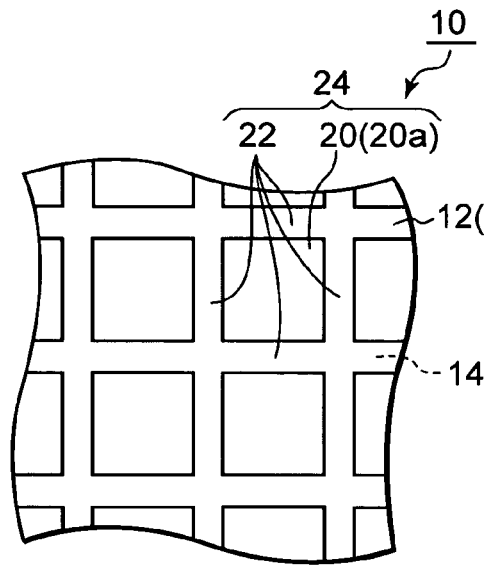
FIGS. 7(A) through 7(D) are respectively fragmentary enlarged process plan views of the junction board corresponding to FIGS. 6(A) through 6(D), according to the third embodiment.

As shown in FIGS. 6(A) and 7(A), a junction board 10 in which integrated circuits 20 are formed in an Si-substrate side main surface 18, is first prepared.

(Process Step 3-i)

Figure 6B:
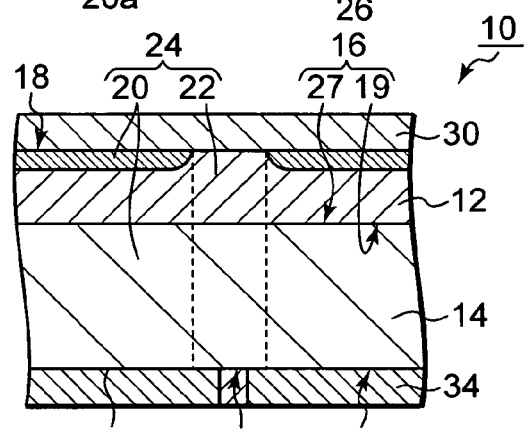
Figure 7B:
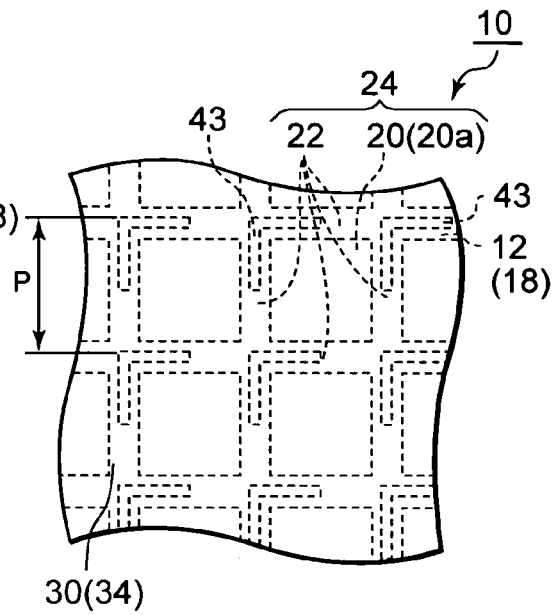

As shown in FIG. 6(B) and FIG. 7(B), the junction board 10 is covered with a positive type photoresist 30. Described in more detail, the whole area of the Si-substrate side main surface 18 is first covered with the positive type photoresist 30. A specific procedure for this work is similar to the (Process Step 1-i) of the first embodiment.

Next, a third main surface 26 of the glass substrate 14 is covered with a positive type photoresist 34. That is, the third main surface 26 is coated with the positive type photoresist 34 in such a manner that openings or apertures each having a width narrower than the width of each scribe area 22 are intermittently formed along the scribed areas 22 with the transverse-direction centers of the scribe areas 22 as the centers. This dashed aperture results in an etching predeterminate area 43 for etching the glass substrate 14. Here, the etching predeterminate area 43 is assumed to be, for example, about 100 μm in width. The length of one etching predeterminate area 43 along the scribe area 22 is about 1 mm or so, for example. The etching predeterminate areas 43 are intermittently formed along the scribe areas 22 with an about 2-mm positive type photoresist 34 coat area interposed therebetween. A specific procedure for this work is similar to the (Process Step 1-i) of the first embodiment.

Here, the etching predeterminate areas 43 are repeatedly formed in all the chip areas 24 existing in the junction board 10 at the same positions of the chip areas 24 with the chip areas 24 as repetitive units. That is, when viewed along an arbitrary scribe area 22, a repetitive pitch P (refer to FIG. 7(B)) of each etching predeterminate area 43 is approximately equal to the length of one side of the chip area 24, extending along the scribe area 22.

Thus, the junction board 10 is obtained in which the etching predeterminate areas 43 are intermittently exposed along the scribe areas 22.

(Process Step 3-ii)

Figure 6C:
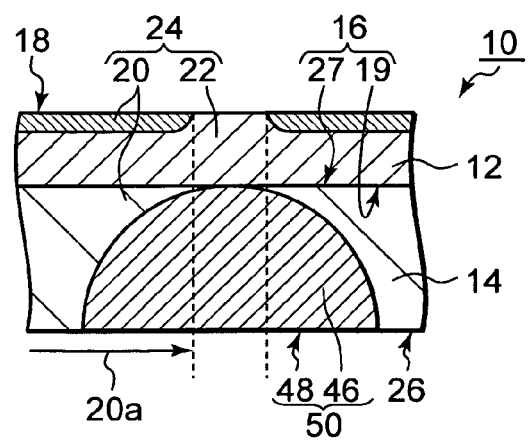
Figure 7C:
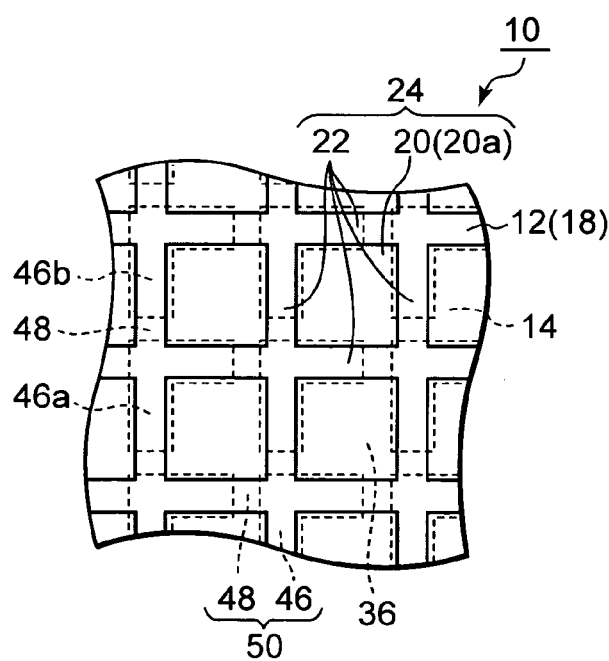
Figure 7D:
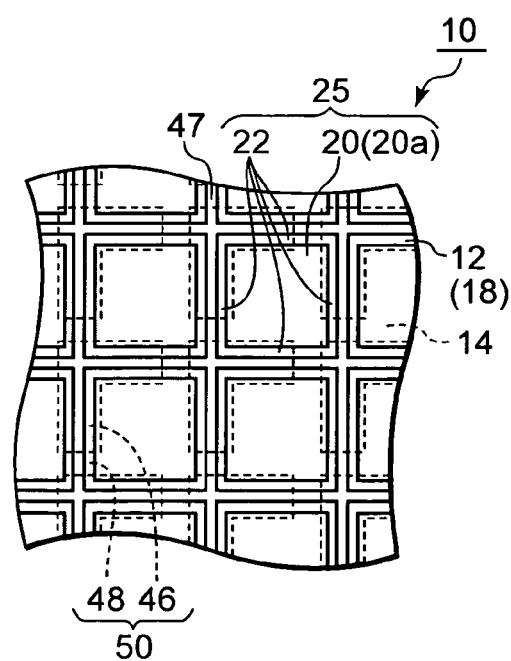

Subsequently, as shown in FIG. 6(C) and FIG. 7(C), wet etching is performed along the scribe areas 22 from the glass-substrate side main surface 26 of the junction board 10. With the execution of the wet etching, hollow or concave grooves 46 each having a depth at which a second main surface 19 of an Si substrate 12 is exposed, are formed in the third main surface 26 of the glass substrate 14 in the etching predeterminate area 43. Thus, the junction board 10 is made thin until each wet-etched portion reaches the junction surface 16. Thereafter, the positive type photoresists 30 and 34 are removed by ashing or the like. A specific procedure for this work is similar to the (Process Step 1-ii) of the first embodiment.

Thus, the concave groove 46, which is 500 μm in depth, about 1 mm in width and about 2 mm in length along each scribe area 22, is formed along the scribe area 22. Here, the size of each concave groove 46 in the glass-substrate side main surface 26 is enlarged as compared with the etching predeterminate area 43 because of the above isotropic etching.

The concave grooves 46 are formed so as to be linearly arranged intermittently in plural form along the scribe areas 22 in association with the etching predeterminate areas 43. That is, when attention is paid to one concave groove 46a, the concave groove 46a and its corresponding concave groove 46b adjacent to each other along the scribe areas 22 are separated from each other by a wall-thick portion 48 corresponding to a non-etched area. Thus, a straight-line like concavo-convex structure, i.e., a linear concavo-convex structure 50 comprising a concave groove 46 having a length of about 2 mm and a wall-thick portion 48 having a length of about 1 mm, which separates between the adjacent concave grooves 46, is formed along the scribe area 22. A repetitive pitch of the concave groove 46 (wall-thick portion 48) of the linear concavo-convex structure 50 extending along each arbitrary scribe area 22 is equal to the length of one side of each chip area 24 along the scribe area 22. Here, the width of the concave groove 46 is formed wider than the width (35 μm) of a dicing blade to be described later. The linear concavo-convex structure 50 functions as a sign indicative of the direction of the chip 25.

As to each individual chip area 24, attention will be paid to the array of the concave grooves 46 and the wall-thick portions 48 of the linear concavo-convex structures 50 formed in the four sides constituting the outer edge of each chip area 24. In FIG. 7(C), the wall-thick portions 48 are formed below the left and right sides of each chip area 24 and on the right hand of its upper and lower sides thereof. That is, the wall-thick portions 48 are respectively formed at the respective sides of each chip area 24 one by one. The middle point of each wall-thick portion 48 as viewed in the direction extending along the scribe area 22 is displaced or shifted from the middle point of the side of the chip area 24 in which the wall-thick portion is provided.

The array of the linear concavo-convex structures 50 at the outer edge of each chip area 24 is repeatedly formed for each chip area 24 with one chip area 24 as a repetitive unit.

When a rotational operation is effected on the corresponding chip area 24 within a plane parallel to the Si-substrate side main surface 18 with the center point of the chip area 24 as a rotational axis, the array of the linear concavo-convex structures 50 at the outer edge of the chip area 24 has a rotational symmetry through more than once and less than twice (i.e., once alone). That is, only when the chip area 24 is rotated 360° within the plane parallel to the Si-substrate side main surface 18 with the center point of the chip area 24 as the rotational axis, the shape of the non-etching area 36 coincides with its original shape. Since the chip area 24 is made rectangular here, the center point of the chip area 24 corresponds to an intersection point of two diagonal lines of the present rectangle.

(Process Step 3-iii)

Figure 6D:
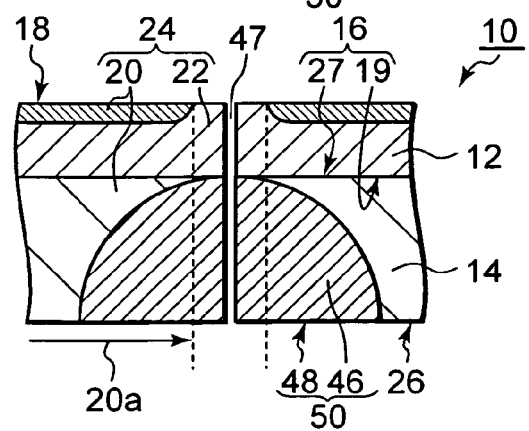

Subsequently, as shown in FIG. 6(D), dicing using the dicing blade is performed from the Si-substrate side main surface 18 of the junction board 10 along cut lines 47 placed in the central portions of the scribe areas 22 as viewed in their transverse directions.

Described in more detail, the junction board 10 is thinned by means of the high-speed rotated dicing blade up to the second main surface 19 of the Si substrate 12 at a portion corresponding to each concave groove 46 and up to the third main surface 26 of the glass substrate 14 at a portion corresponding to each wall-thick portion 48, respectively, whereby the junction board 10 is cut. Thus, the individual chip areas 24 are cut and separated from one another to obtain the respective chips 25. Here, the width, material and rotational speed of the dicing blade are similar to those in the (Process Step 1-iii) of the first embodiment.

Each of the chips 25 separated from one another in this way has such a plane shape that at the outer edge of the chip 25, a portion corresponding to the wall-thick portion 48 protrudes toward the outside of the integrated circuit area 20a and a portion corresponding to the concave groove 46 is relatively caved or depressed toward the inside of the integrated circuit area 20a. Thus, the chip 25 has a rotational symmetry through more than once and less than twice (i.e., once alone) where a rotational operation is effected on the chip 25 within the plane parallel to the Si-substrate side main surface 18 with the center point of the chip 25 as a rotational axis.

In the cutting method for the junction board 10, according to the present embodiment as described above, the concave groove 46 and the wall-thick portion 48 constitute the linear concavo-convex structure 50 continuous in the form of a broken line along the scribe areas 22. Thus, the thickness of the junction board 10 to be cut upon dicing can be thinned at the concave groove 46 portion of the linear concavo-convex structure 50. Consequently, the total value of the thickness of the junction board 10 which must be cut by the dicing blade, can be made smaller than conventional. Thus, it is not necessary to carry out the step cut conventionally used in cutting of the junction board 10 to which the substrates different in hardness have been bonded. Therefore, the time required to cut it by the dicing blade can be shortened.

The concave grooves 46 are separated from each other by the wall-thick portion 48 having a thickness equal to the glass substrate 14. Thus, since the junction board 10 holds a sufficient mechanical strength even after the completion of the wet etching in the (Process Step 3-i), warpage of the junction board 10 can be suppressed.

With the width of the concave groove 46 being formed wider than the width (35 µm) of the dicing blade, each of the wall-thick portions 48 can be brought into such a shape as to protrude toward the outside of the integrated circuit area 20a after the dicing. Thus, it is possible to cause the wall-thick portion 48 to function as a sign indicative of the direction of the chip 25.

Since the array of the wall-thick portions 48 and concave grooves 46 provided at the circumferential outer edge of the chip 25 is formed so as to have the rotational symmetry through only once, this array can be set as a sign indicative of the direction of the chip 25.

Since the linear concavo-convex structures 50 are formed in such a manner that the middle point of the wall-thick portion 48 does not coincide with the middle point of each side of the chip 25, the array of the linear concavo-convex structures 50 at the outer edge of the chip 25 functions as a sign indicative of the direction of the chip 25.

Incidentally, although the wall-thick portions 48 and the concave grooves 46 are formed in the respective sides of the chip area 24 one by one in the present embodiment, a plurality of wall-thick portions 48 and concave grooves 46 may be formed in the respective sides if the array of the wall-thick portions 48 and the concave grooves 46 is formed so as to have the rotational symmetry through once alone. The wall-thick portions 48 and concave grooves 46 may be formed two by two at the respective sides of the chip area 24 by shortening the lengths along the scribe area 22, of the wall-thick portion 48 and the concave groove 46 to, for example, 0.5 mm and 1 mm respectively.

Although the ratio between the lengths along the scribe area 22, of the wall-thick portion 48 and the concave groove 46 is set to 1:2 (=wall-thick portion 48:concave groove 46) in the present embodiment, no restriction is imposed on the ratio therebetween if after the completion of the (Process Step 3-ii), the junction board 10 holds a sufficient mechanical strength and dicing can be done without performing step cut in the (Process Step 3-iii).

Incidentally, although the concave groove 46 is set to a depth extending from the glass-substrate side main surface 26 to the junction surface 16, it may be set to a depth which extends beyond the junction surface 16 and enters into the Si substrate 12. Since the thickness of the Si substrate 12 that the dicing blade must cut in the (Process Step 3-iii) is reduced by doing so, dicing can be performed more promptly.

The width of the scribe area 22 may preferably be set to such a width as described in the first embodiment.

If the dicing in the (Process Step 3-iii) falls within the width range of the scribe area 22, then cutting may be carried out with the dicing being shifted from the center line.

The size and shape of the chip 20, the combination of the two types of substrates constituting the junction board 10, the thicknesses of the Si substrate 12 and the glass substrate 14, and the photoresists used in coating, and the like can be changed in various ways such as described in the first embodiment.

While the preferred forms of the present invention have been described, it is to be understood that modifications will be apparent to those skilled in the art without departing from the spirit of the invention. The scope of the invention is to be determined solely by the following claims.

What is claimed is:

1. A method for cutting a junction board, comprising:
   providing a junction board comprising two bonded substrates, by
   bonding a second main surface of a first substrate having a first main surface provided with a plurality of chip areas and scribe areas demarcating a plurality of the chip areas from one another and the second main surface opposite to the first main surface, to a fourth main surface of a second substrate harder than the first substrate, having a third main surface and the fourth main surface opposite to the third main surface,
   said method further comprising steps of:
   (1) performing wet etching to create concave grooves in the junction board and expose the second main surface, the etching being performed at the third main surface on areas given by orthogonal projection of the scribe areas of the first main surface onto the third main surface; and
   (2) performing dicing using a dicing blade along the scribe areas of the first main surface until the exposed second main surface is reached, thereby to cut the junction board.

2. The method according to claim 1, comprising, in said step (1), forming the width of each of the concave grooves wider than the width of the dicing blade.

3. The method according to claim 2, wherein on each of the chip areas within a plane parallel to the first main surface of the first substrate with a center point of the chip area as a rotational axis in said step (1), each of concavo-convex shapes of outer edges in non-etching areas of the chip areas, having remained by the wet etching, is formed such that only when the chip area is rotated 360° within the plane, the concavo-convex shape of the outer edge in the non-etching area coincides with its original shape, and the concavo-convex shapes of the outer edges in a plurality of the chip areas are formed identical to one another.

4. The method according to claim 1, wherein a silicon substrate is used as the
   first substrate, a glass substrate is used as the second substrate, and hydrofluoric acid is used as an etchant for the wet etching.

5. A chip obtained by using the junction board cutting method according to claim 1.

6. A method for cutting a junction board, comprising:
providing a junction board comprising two bonded substrates, by
bonding a second main surface of a first substrate having a first main surface provided with a plurality of chip areas and scribe areas demarcating a plurality of the chip areas from one another and the second main surface opposite to the first main surface, to a fourth main surface of a second substrate harder than the first substrate, having a third main surface and the fourth main surface opposite to the third main surface,
said method further comprising steps of:
(1) performing dicing along the scribe areas from the first main surface using a dicing blade until the fourth main surface is exposed, to thereby create concave grooves in the junction board; and
(2) performing wet etching at the third main surface on areas given by orthogonal projection of the scribe areas of the first main surface onto the third main surface until the exposed fourth main surface is reached, to cut the junction board, thereby obtaining the chips.

7. The method according to claim 6, wherein on each of the chip areas within a plane parallel to the first main surface of the first substrate with a center point of the chip area as a rotational axis in said step (2), each of concavo-convex shapes of outer edges in non-etching areas of the chip areas, having remained by the wet etching, is formed such that only when the chip area is rotated 360° within the plane, the concavo-convex shape of the outer edge in the non-etching area coincides with its original shape, and the concavo-convex shapes of the outer edges in a plurality of the chip areas are formed identical to one another.

8. The method according to claims 6, wherein a silicon substrate is used as the first substrate, a glass substrate is used as the second substrate, and hydrofluoric acid is used as an etchant for the wet etching.

9. A chip obtained by using the junction board cutting method according to claim 6.

10. A method for cutting a junction board, comprising:
providing a junction board comprising two bonded substrates, by
bonding a second main surface of a first substrate having a first main surface provided with a plurality of chip areas and scribe areas demarcating a plurality of the chip areas from one another and the second main surface opposite to the first main surface, to a fourth main surface of a second substrate harder than the first substrate, having a third main surface and the fourth main surface opposite to the third main surface,
said method further comprising steps of:
(1) performing wet etching on areas at the third main surface on areas given by orthogonal projection of the scribe areas of the first main surface onto the third main surface to intermittently form concave grooves in which the second main surface is exposed, and
forming linear concavo-convex structures in which the concave grooves adjacent to one another along the areas given by the orthogonal projection of the scribe areas to the third main surface are separated from one another by wall-thick portions used as non-etching areas; and
(2) performing dicing on the scribe areas from the first main surface using a dicing blade up to the exposed second main surface at portions corresponding to the concave grooves and up to the third main surface at portions corresponding to the wall-thick portions to thereby cut the junction board.

11. The method according to claim 10, wherein in said step (1), the width of each of the concave grooves is formed wider than the width of the dicing blade.

12. The method according to claim 11, wherein on each of the chip areas within a plane parallel to the first main surface with a center point of the chip area as a rotational axis in said step (1), an array of the concave grooves and the wall-thick portions in each of the linear concavo-convex structures formed in four sides constituting an outer edge of said each chip area is formed such that only when the chip area is rotated 360° within the plane, the concavo-convex shape of the outer edge in the non-etching area coincides with its original shape, and arrays of the concave grooves and the wall-thick portions in a plurality of the chip areas are formed identical to one another.

13. The method according to claim 12, wherein
when the array comprises the concave grooves adjacent to the wall-thick portions and the wall-thick portions respectively provided one by one in the four sides of said each chip area, and
a middle point of each of the wall-thick portions as viewed in a direction along the scribe area is shifted from a middle point of a side of the chip area provided with the wall-thick portion.

14. The method according to claim 10, wherein a silicon substrate is used as the first substrate, a glass substrate is used as the second substrate, and hydrofluoric acid is used as an etchant for the wet etching.

15. A chip obtained by using the junction board cutting method according to claim 10.

16. The method according to claim 1, wherein the second main surface and the fourth main surface are planar.

17. The method according to claim 6, wherein the second main surface and the fourth main surface are planar.

18. The method according to claim 10, wherein the second main surface and the fourth main surface are planar.

* * * * *